United States Patent [19]
Nakanishi et al.

[11] Patent Number: 5,517,479
[45] Date of Patent: May 14, 1996

[54] OPTICAL HEAD INCLUDING A SEMICONDUCTOR LASER HAVING A NON-SCATTER INCIDENT AREA

[75] Inventors: Hideyuki Nakanishi, Kyoto; Akira Ueno, Katano; Hideo Nagai, Takatsuki; Akio Yoshikawa, Ibaraki, all of Japan

[73] Assignee: Matsushita Electronics Corporation, Takatsuki, Japan

[21] Appl. No.: 217,722

[22] Filed: Mar. 25, 1994

[30] Foreign Application Priority Data

Mar. 26, 1993 [JP] Japan .................................. 5-068335

[51] Int. Cl.$^6$ .................. G11B 7/00; G02B 5/32
[52] U.S. Cl. .................. 369/109; 369/44.32; 369/44.37; 369/112; 369/122; 359/15; 257/80
[58] Field of Search .................. 369/109, 112, 369/122, 110, 44.23, 44.17, 44.37, 103, 13, 44.32; 372/36, 49; 359/15, 19; 257/80–85

[56] References Cited

U.S. PATENT DOCUMENTS

| | | | |
|---|---|---|---|
| 4,742,506 | 5/1988 | Fukumoto et al. | 369/112 |
| 4,794,585 | 12/1988 | Lee | 369/112 |
| 4,987,566 | 1/1991 | Shikama et al. | 369/122 |
| 5,111,449 | 5/1992 | Kurata et al. | 369/122 |
| 5,231,620 | 7/1993 | Ohuchida | 369/112 |
| 5,245,620 | 9/1993 | Tanaka et al. | 372/36 |
| 5,355,385 | 10/1994 | Amano et al. | 372/49 |
| 5,396,061 | 3/1995 | Taniguchi et al. | 369/112 |
| 5,408,450 | 4/1995 | Nagahama et al. | 369/112 |
| 5,416,765 | 5/1995 | Aikoh et al. | 369/112 |
| 5,422,870 | 6/1995 | Kojima et al. | 369/112 |
| 5,428,584 | 6/1995 | Yoshida et al. | 369/112 |

FOREIGN PATENT DOCUMENTS

| | | |
|---|---|---|
| 0171929 | 2/1986 | European Pat. Off. . |
| 0210582 | 2/1987 | European Pat. Off. . |
| 0348950 | 1/1990 | European Pat. Off. . |
| 61-24031 | 2/1986 | Japan . |
| 1035737 | 2/1989 | Japan . |
| 1-35737 | 2/1989 | Japan . |

*Primary Examiner*—Georgia Y. Epps
*Assistant Examiner*—Kim-Kwok Chu
*Attorney, Agent, or Firm*—Willian Brinks Hofer Gilson & Lione

[57] ABSTRACT

An optical head for optical recording and reproducing apparatuses is disclosed. The optical head comprises a semiconductor laser, a mirror for reflecting a light beam emitted from the semiconductor laser, a diffraction grating for dividing the light beam into zero order, plus and minus first-order beams. It also comprises a holographic diffraction grating being arranged at an optical path of the beams divided by the diffraction grating, an objective lens for focusing the beams on a disk and causing the beams reflected from the disk to be incident on the holographic diffraction grating to diffract the beams, and a photodetector for detecting a tracking error signal by receiving the beams diffracted by the holographic diffraction grating. The semiconductor laser has a beam incident area onto which the beam reflected from the disk is incident. The beam incident area acts to scatter or absorb the incident beam. As a result, the optical head is able to obtain a stable tracking error signal.

16 Claims, 9 Drawing Sheets

5,517,479

OPTICAL HEAD INCLUDING A SEMICONDUCTOR LASER HAVING A NON-SCATTER INCIDENT AREA

FIELD OF THE INVENTION

The present invention relates to an optical head for optical recording and reproducing apparatuses.

BACKGROUND OF THE INVENTION

An optical head integrating a light source and a photodetector has been proposed. The optical head disclosed in Japanese Patent Laid-Open 35737/1989 is an example. FIG. 13 shows a perspective view of the optical head disclosed above and FIG. 14 shows a schematic view of its optical system. The optical head chip 1a has first and second photodetectors 9 and 10 having five regions respectively on first and second substrates 2 and 8. The second substrate 8 is mounted on the first substrate 2. A semiconductor laser chip 5 is mounted on the second substrate 8 and a monitoring photodetector 4 is also formed on the second substrate 8.

A prism 11 is set on the first substrate 2. The prism 11 has a trapezoidal section, its grade plane 11a acts as a mirror and its vertical plane 11b faces to a exit of the semiconductor laser chip 5. A first diffraction grating 12 is formed on a top plane 11c of the prism 11. A second diffraction grating 13 is arranged above the first diffraction grating 12.

The outline of operation of this optical head is as follows: A beam emitted from the semiconductor laser chip 5 is reflected by the grade plane 11a of the prism 11 and incident onto the first diffraction grating 12. The diffraction grating 12 divides the beam into three beams, a zero-order beam for reading information and plus and minus first-order beams for detecting a tracking error. The three beams pass the second diffraction grating 13 and are focused by an objective lens 18 on a disk 19. The three beams focused on the disk 19 are reflected from the disk 19 and are incident onto the second diffraction grating 13 through the objective lens 18. The incident beams are divided into plus and minus first-order beams by the second diffraction grating 13 and transmitted to the first and second photodetectors 9 and 10.

Because the first and second photodetectors 9 and 10 are arranged in front of and behind the exact point of focus as shown in FIG. 15, spot sizes imaged on the photodetectors 9 and 10 associated with the shift of the focus point on the disk 19 cause the reverse change to each other. The focus error is detected by the beam size method utilizing this phenomenon. The tracking error is detected by a tri-beam method employing the plus and minus first-order beams for the tracking generated by the first diffraction grating 12.

When the semiconductor laser chip 5 is arranged in close proximity to the prism 11 to miniaturize further the integrated optical head mentioned above, it follows that either of the two first-order beams for detecting the tracking error reflected from the disk 19 passes the second diffraction grating 13 and is reflected from a surface faced to the second diffraction grating 13 on the semiconductor laser chip 5 and returns again onto the disk 19. The fact that the beam returned interferes with the two first-order beams for detecting the tracking error signal and the tracking error signal causes an offset as has been disclosed in Japanese Patent Laid-Open 24031/1986. For avoiding this interference, a method forming an optical shielding which scatters or absorbs the light at the exit of the semiconductor laser has been proposed in Japanese Patent Laid-Open 24031/1986.

However, in the miniature optical head integrating the light source and the photodetector as mentioned above, because either of the two first-order beams for detecting the tracking error reflected from the disk 19 is incident onto the surface faced to the second diffraction grating 13 on the semiconductor laser chip 5 or onto the surface located on the opposite side from said semiconductor laser chip 5 with respect to the grade plane 11a acted as the mirror and faced to the diffraction grating 13, the method proposed in Japanese Patent Laid-Open 24031/1986 can not prevent the interference.

SUMMARY OF THE INVENTION

An object of the present invention is to provide an optical head for optical recording and reproducing apparatuses which has a light source and a photodetector integrated and is able to produce a stable tracking error signal.

A preferred embodiment according to the present invention comprises:

a semiconductor laser;

a mirror for reflecting a light beam emitted from said semiconductor laser so as to deflect an optical path of said light beam;

a diffraction grating which is arranged in close vicinity to said semiconductor laser for dividing said light beam reflected from said mirror into three beams in which there are zero-order, plus and minus first-order beams;

a holographic diffraction grating being arranged at an optical path of said three beams divided by said diffraction grating;

an objective lens for focusing said three beams transmitted through said holographic diffraction grating on an optical recording medium and causing said three beams reflected from said optical recording medium to be incident on said holographic diffraction grating so as to diffract said three beams; and a photodetector for detecting a tracking error signal by receiving a light beam diffracted by said holographic diffraction grating;

said semiconductor laser has a beam incident area, formed on a surface faced to said diffraction grating, to which either of said two first-order beams reflected from said optical recording medium passing through said objective lens, said holographic diffraction grating and said diffraction grating is incident without passing said mirror.

The present invention itself, together with further objects and attendent advantages, will best be understood by reference to the following detailed description of the preferred embodiments taken in conjunction with the accompanying drawings.

DESCRIPTION OF THE PREFERRED EMBODIMENTS

Figure 1:
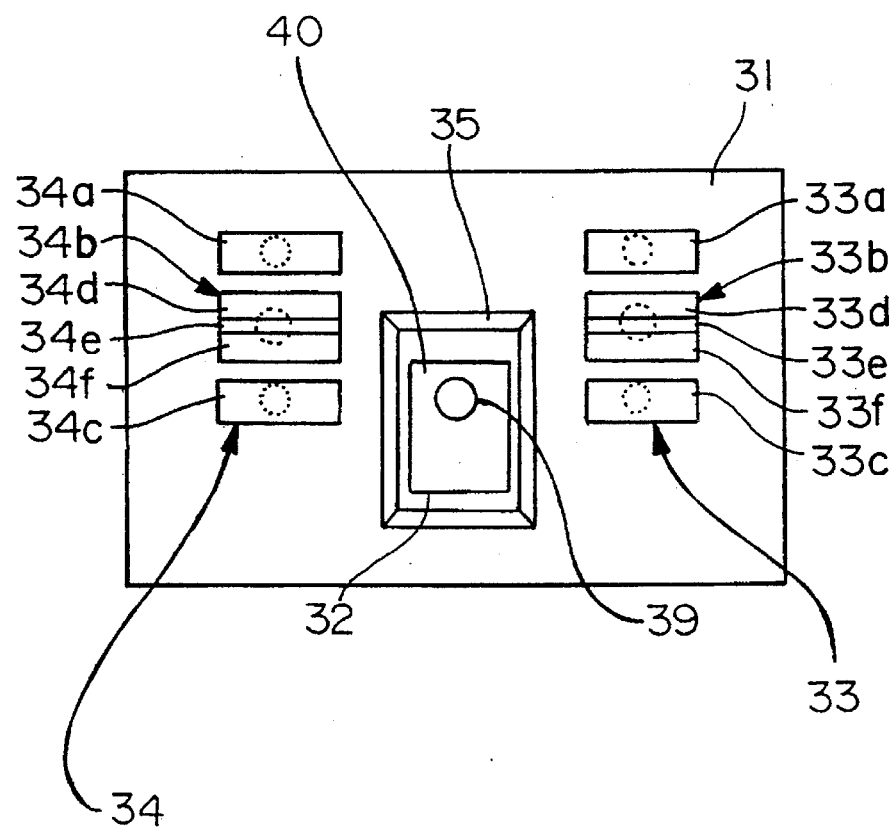
FIG. 1 is a front view of an embodiment of an optical head according to the present invention.
Figure 2:
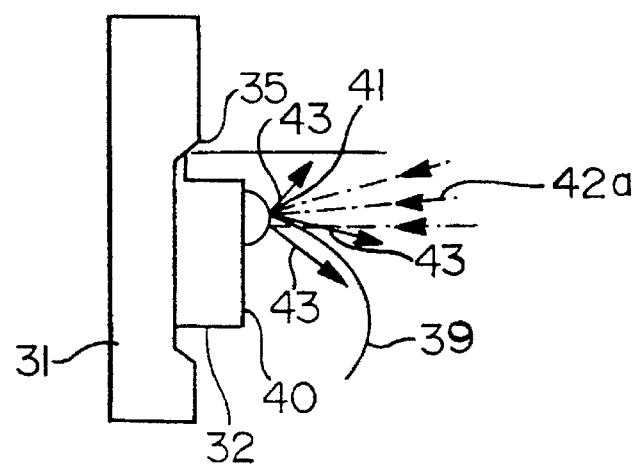
FIG. 2 is a sectional view of a semiconductor laser chip mounted on substrate illustrated in FIG. 1.

FIG. 1 shows a front view of an embodiment of an optical head according to the present invention and FIG. 2 shows a sectional view of a semiconductor laser chip mounted on a substrate illustrated in FIG. 2.

On a substrate 31, photodetectors consisting of five region 33 and 34 and a mirror 35 made of the chemical anisotropic etching are formed. A semiconductor laser chip 32 is mounted at the position faced to the mirror 35.

A feature of this embodiment is the fact that a wire bonding portion 41 joining a wire 39 to an electrode surface 40 is formed on the electrode surface 40 of the semiconductor laser chip 32.

Figure 3:
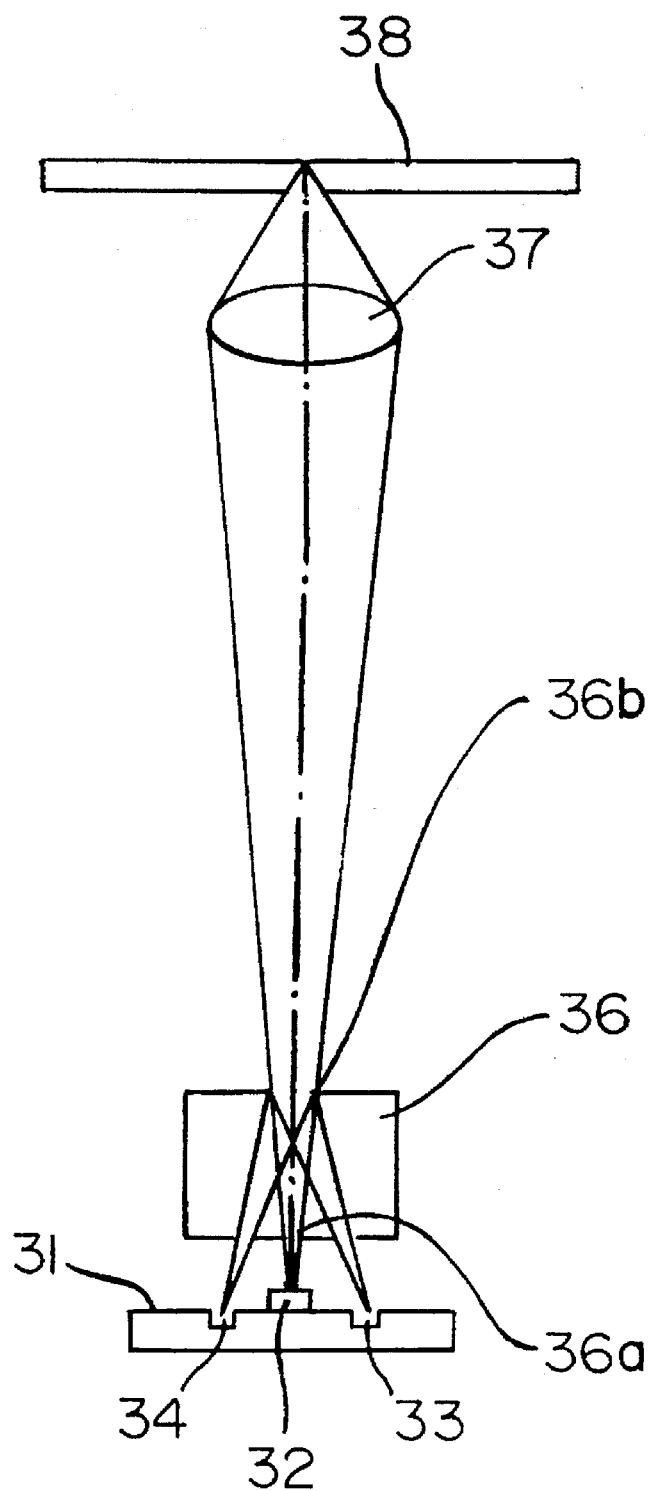
FIG. 3 is a schematic view of an optical system of the embodiment spoon in FIG. 1.
Figure 4A:
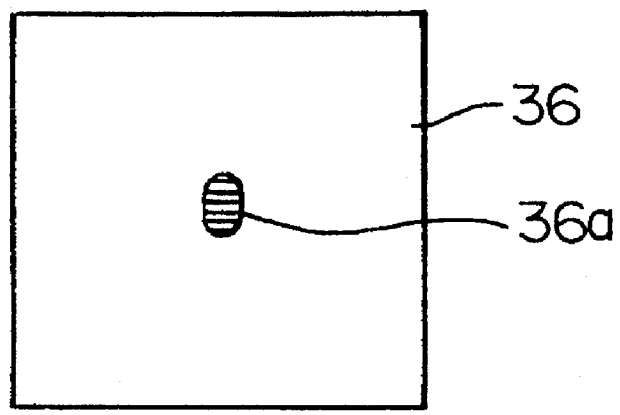
FIG. 4A and 4B are schematic views of a diffraction grating and a holographic diffraction grating of the embodiment according to the present invention.
Figure 4B:
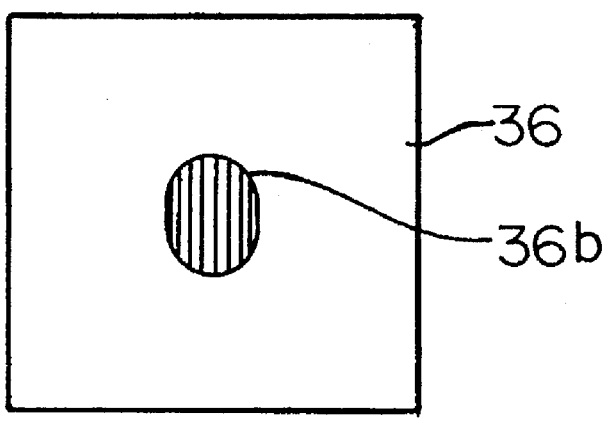

Referring to FIG. 1, FIG. 2, FIG. 3 showing a schematic view of an optical system of the embodiment, and FIG. 4 showing schematic views of a diffraction grating and a holographic diffraction grating of the embodiment, the operation of the optical head will be explained in the following paragraphs.

A beam emitted from the semiconductor laser chip 32 is reflected by the mirror 35 as indicated by the arrow and incident onto a diffraction grating 36a formed on the bottom of a transparent optical element 36. The diffraction grating 36a divides the incident beam into three beams, a zero-order main beam for reading information and plus and minus first-order sub beams for detecting a tracking error. The beams pass holographic diffraction grating 36b formed on the top of the transparent optical element 36 and are focused on a disk 38 by an objective lens 37. The focused beam is reflected from the disk 38 and incident onto the holographic diffraction grating 36b through the objective lens 37. The holographic diffraction grating 36b divides the incident beam into plus and minus first-order beams. The divided beams are imaged onto the photodetectors 33 and 34.

The tracking error signal is produced by a tri-beam tracking method in which a difference of intensity between the beams reflected from the disk 38 is detected by the photodetectors 33a, 33c, 34a, and 34c. That is, the tracking error signal TE is given by:

$$TE=(G+I)-(H+J)$$

where G, H, I, and J are outputs of the photodetector 33a, 33c, 34a, and 34c.

In FIG. 1 to FIG. 3, the other sub beam 42a reflected from the disk 38 is incident onto the electrode surface 40 faced to the diffraction grating 36a. The electrode surface 40 is P or N type electrode of the semiconductor laser chip 32. In the beam incident area of the electrode surface 40, the wire 39 is bonded so as to supply an electric current into the semiconductor laser chip 32. If it is only to supply the electric current, the bonding position can be random and it is normally bonded on the electrode surface 40 near the center. However, because in this embodiment the wire bonding portion 41 is located on the beam incident area of the beam 42a, the incident beam 42a is reflected by a dome of the wire bonding portion 41 and thus it becomes a scattered light 43.

Because the scattered light 43 has a very large spread angle compared to the incident beam 42a, the amount of the scattered light which returns again to the disk 38 through the objective lens 37 is lessened significantly. Therefore, it is possible to minimize an interference about the beam for detecting the tracking error signal due to the fact that the light reflected from the electrode surface 40 returns to the disk 38.

In above optical head, the detection of the focus error is as follows;

The holographic diffraction grating 36b is formed in such a way that the two first-order diffraction beams are imaged onto the front and back of the photodetectors 33 and 34. Because the spot sizes on the photodetectors cause the reverse change to each other when the beam on the disk 38 is defocused, the focusing error can be detected. The focus error signal FE is given by:

$$FE=(A+C+E)-(B+D+F)$$

where A, B, C, D, E, and F are outputs of the photodetectors 33d, 33e, 33f, 34d, 34e, and 34f.

Figure 7:
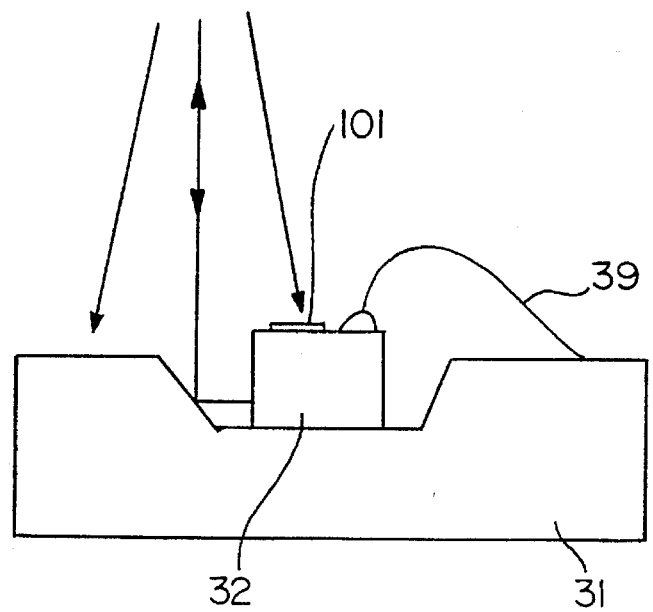
FIG. 7 to FIG. 12 are schematic views of the semiconductor laser chip and its environs according to the present invention.

In the embodiment mentioned above there is scattered the sub beam which is a cause of the interference by the wire bonding portion 41. The different methods which give the similar effect are as follows:

A method preventing the reflection of the incident beam by giving a nonreflection coating 101 on the beam incident area of the semiconductor laser chip 32 is shown in FIG. 7.

Figure 8:
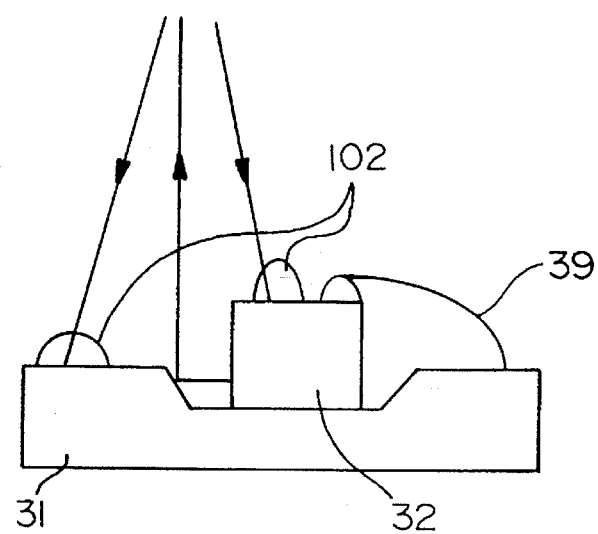

The other method is to scatter or to absorb the incident beam by forming a dome-like projection 102 on the beam incident area of the semiconductor laser chip 32 as shown in FIG. 8. The dome-like projection 102 can form by bonding a resin or the wire.

Figure 9:
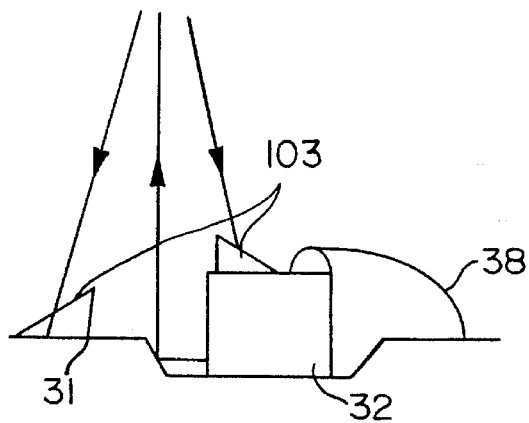

The other method is to scatter the incident beam or to reflect the incident beam in an unaffected direction or to absorb the incident beam by mounting a prism-like projection 103 on the beam incident area of the semiconductor laser chip 32 as shown in FIG. 9. The prism-like projection 103 can be formed by bonding a microscopic prism or by etching the semiconductor laser chip 32.

Figure 10:
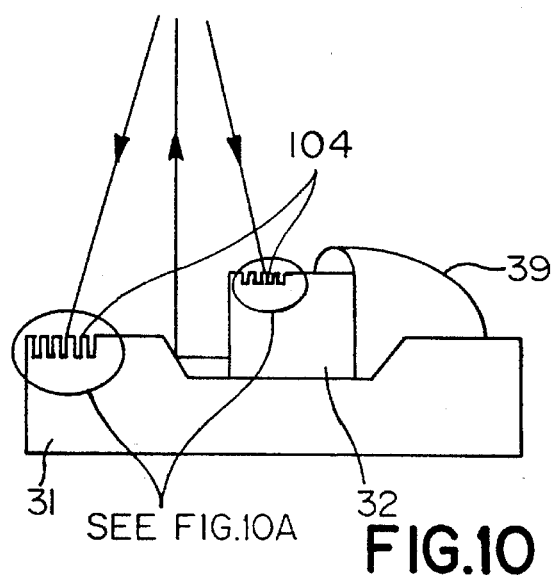
Figure 10A:
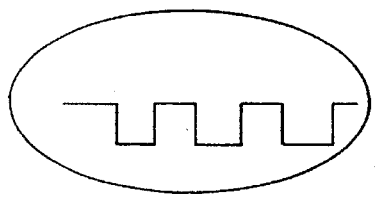

The other method is to diffract and to scatter the incident beam by forming a grating-like unevenness 104 on the beam incident area of the semiconductor laser chip 32 as shown in FIG. 10: The grating-like unevenness 104 can form by mounting a plate processed in the grating-like unevenness form on the semiconductor laser chip 32 or by etching the semiconductor laser chip 32 in the grating-like form.

Figure 11:
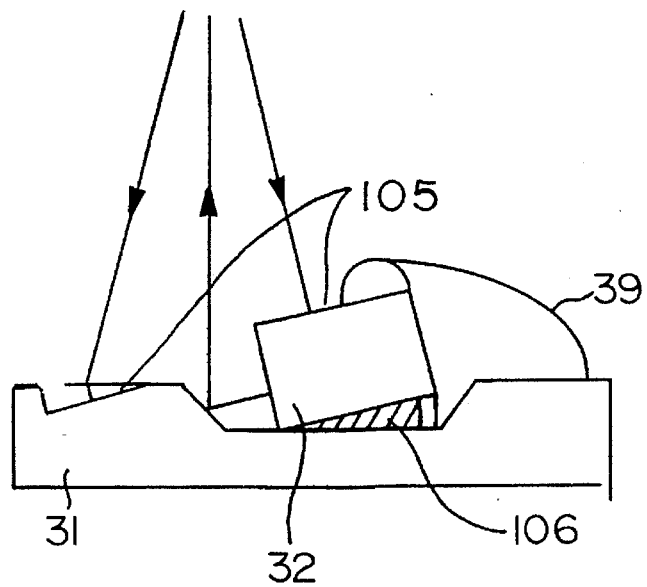

The other method is to deflect the incident beam in the unaffected direction by inclining the semiconductor laser chip 32 as shown in FIG. 11. It can form by soldering the inclined semiconductor laser chip 32 or by mounting the semiconductor laser chip 32 via a triangular spacer. Two inclined surfaces 105 may be formed in this method.

Figure 12:
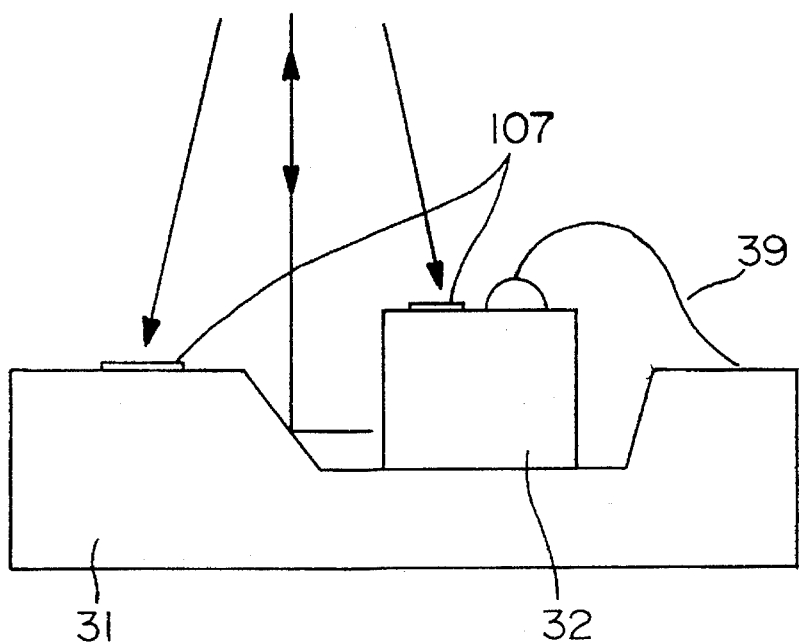
Figure 13:
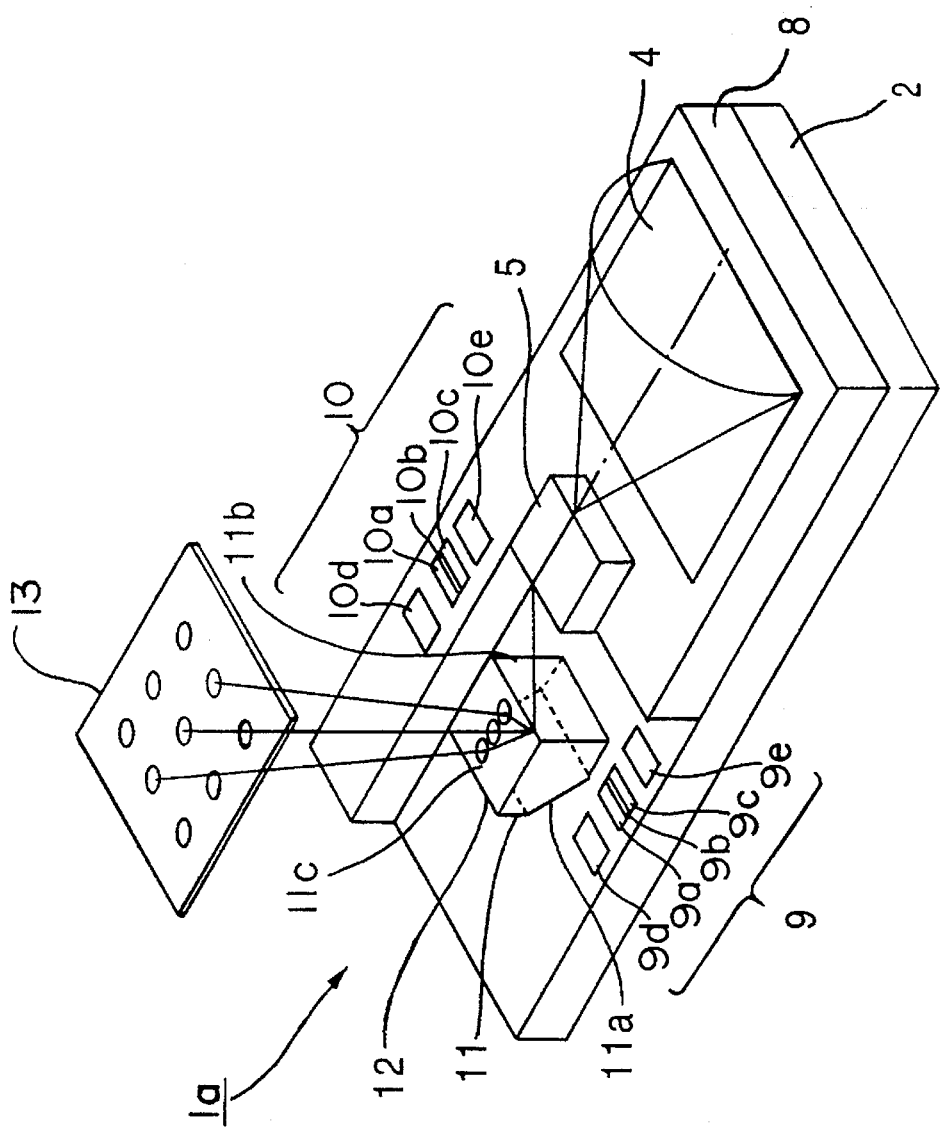
FIG. 13 is a perspective view of the conventional optical head.
Figure 14:
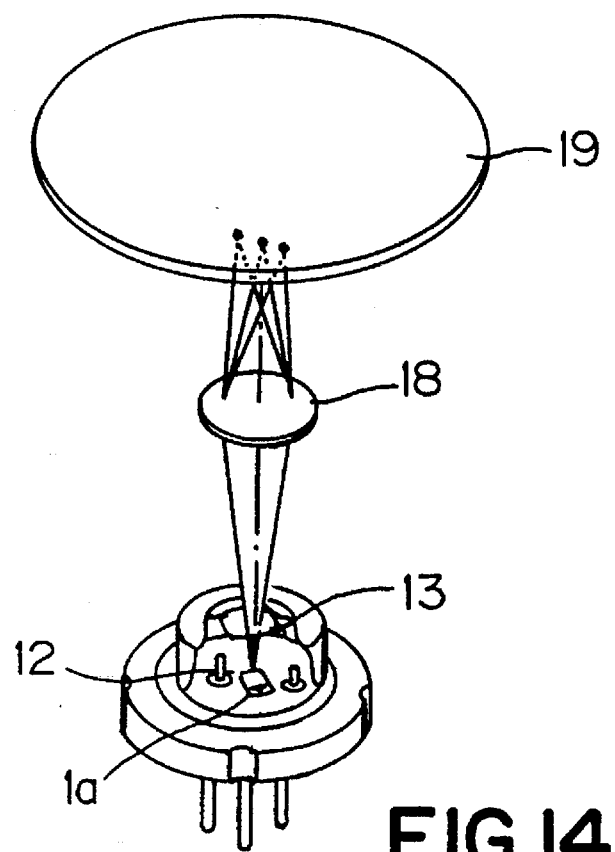
FIG. 14 is a schematic view of the optical system of the conventional optical head.
Figure 15:
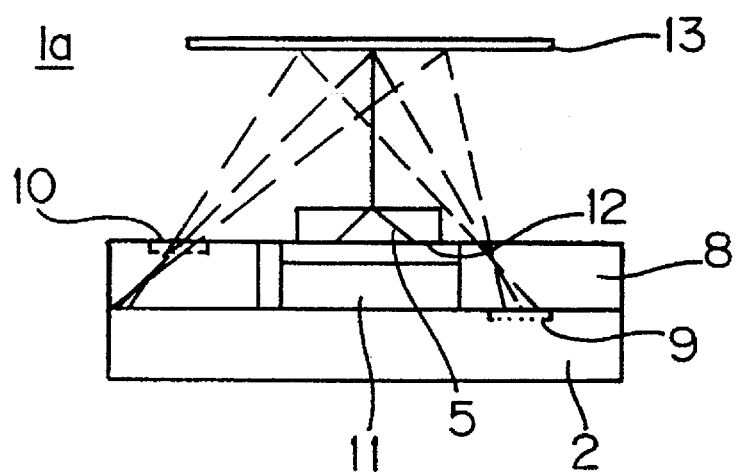
FIG. 15 is a sectional view of the conventional optical head.

The other method is to scatter the incident beam by forming a frosted glass-like roughened surface 107 on the beam incident area of the semiconductor laser chip 32 as shown in FIG. 12. It can form by mounting a plate having a roughened surface or by giving the toughened coating on the semiconductor laser chip 32 or by etching the semiconductor laser chip 32 (for example, the roughened surface can be formed by etching a gold thin film with the use of an iodine fluid).

Figure 5:
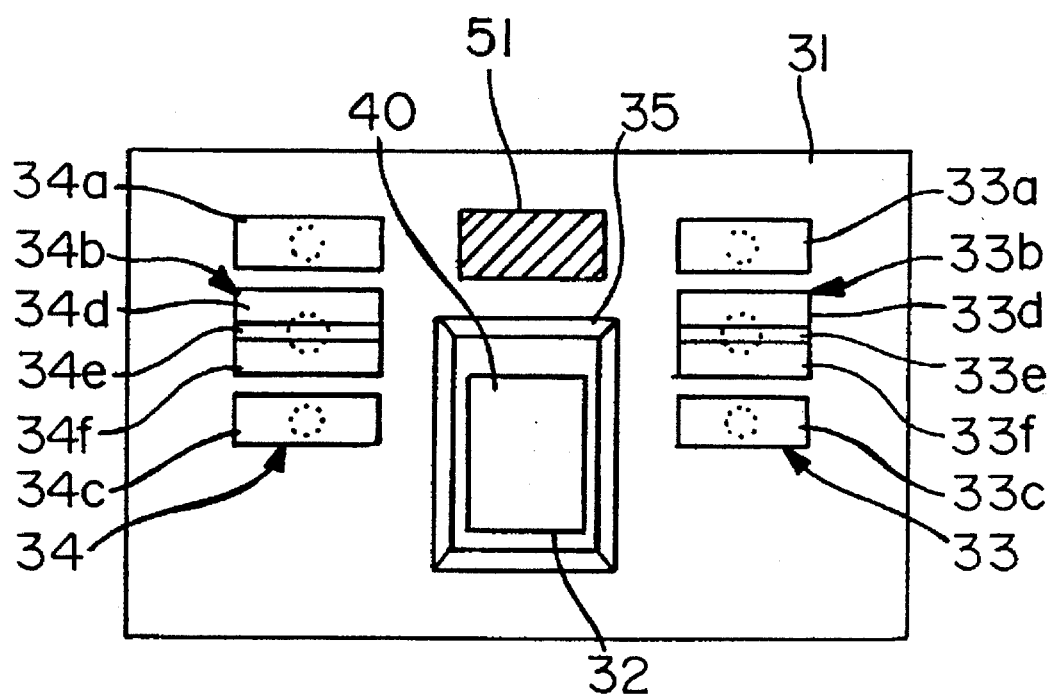
FIG. 5 is a front view of another embodiment of an optical head according to the present invention.
Figure 6:
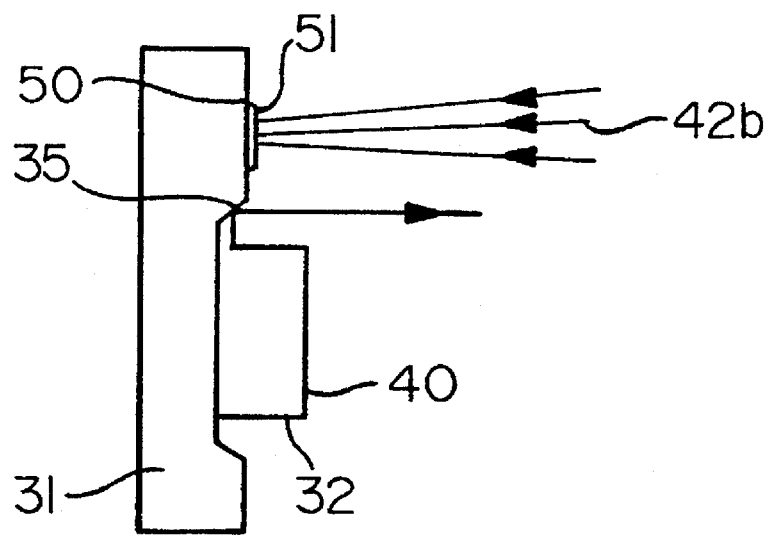
FIG. 6 is a sectional view of a semiconductor laser chip mounted on a substrate illustrated in FIG. 5.

FIG. 5 shows a front view of another embodiment of an optical head according to the present invention and FIG. 6 shows a sectional view of a semiconductor laser chip and a substrate illustrated in FIG. 5.

A feature of this embodiment is tile fact that a nonreflection coating 51 is given on the substrate 31 as shown in FIG. 5 and FIG. 6. The nonreflection coating 51 is given on an area of opposite side from the semiconductor laser chip 32 with respect to the mirror 35. The mirror 35 and the photodetectors 33 and 34 are the same as the embodiment shown in FIG. 1.

The operation producing the tracking error signal TE of this embodiment is the same as the embodiment shown in FIG. 1.

In this embodiment, the other sub beam 42b (the opposite sub beam from the sub beam 42a of FIG. 2) reflected from the disk 38 is incident onto a surface 50 which is given the nonreflection coating 51. Because there is the nonreflection coating 51 on the beam incident area, almost all of the incident beam 42b is absorbed into the substrate 31. Therefore, the amount of the light beam which returns again to the disk 38 through the objective lens 37 becomes approximately zero. That is, it is possible to minimize the interference about the beam for detecting the tracking error signal due to the fact that the light beam reflected from the surface 50 returns to the disk 38.

The operation producing the focus error signal of this embodiment is the same as in the embodiment shown in FIG. 1.

In this embodiment there is absorbed the sub beam which is a cause of the interference by the nonreflection coating 51. The different methods which give similar effects are as follows:

A method is to scatter or to absorb the incident beam by forming a dome-like projection 102 on the beam incident area of the substrate 31 as shown in FIG. 8. The dome-like projection 102 can form by bonding a resin or the wire.

The other method is to scatter the incident beam or to reflect the incident beam in an unaffected direction or to absorb the incident beam by mounting a prism-like projection 103 on the beam incident area of the substrate 31 as shown in FIG. 9. The prism-like projection 103 can form by bonding a microscopic prism or by etching the substrate 31.

The other method is to diffract and to scatter the incident beam by forming a grating-like unevenness 104 on the beam incident area of the substrate 31 as shown in FIG. 10. The grating-like unevenness 104 can form by mounting a plate processed in the grating-like unevenness form on the substrate 31 or by etching the substrate 31 in the grating-like form.

The other method is to deflect the incident beam in the unaffected direction by inclining the beam incident area on the substrate 31 as shown in FIG. 11. It can form by etching obliquely the substrate 31.

The other method is to scatter the incident beam by forming a frosted glass-like roughened surface 107 on the beam incident area of the substrate 31 as shown in FIG. 12. It can form by mounting a plate having a roughened surface or by giving the roughened coating on the substrate 31 or by etching the substrate 31 (for example, the roughened surface can be formed by etching a gold thin film with the use of an iodine fluid).

These embodiments are used with the mirror formed by etching the substrate, but the mirror formed by other materials (glass, metal, ceramics, etc.) can produce a the similar effect.

As mentioned above, the optical head miniaturized by integrating the light source and the photodetector according to the present invention is able to prevent the interference which was at state on the conventional optical head by forming the beam incident area in such a way as to scatter or to absorb the following two incident beams.

1) The sub beam, which is produced by the diffraction grating, being reflected from the disk, passing through the objective lens, the holographic diffraction grating, and the diffraction grating, incident on the surface of the semiconductor laser chip faced to the diffraction grating.

2) The other sub beam, which is produced by the diffraction grating, being reflected from the disk, passing through the objective lens, the holographic diffraction grating, and the diffraction grating, incident on the surface of opposite side from the semiconductor laser chip with respect to the mirror on the substrate faced to the diffraction grating.

As a result, it becomes possible to obtain the stable tracking error signal, because there is no generation of the. offset in tile tracking error signal due to the tangential skew of the disk.

The invention may be embodied in other specific forms without departing from the spirit or essential characteristics thereof. The present embodiment is therefore to be considered in all respects as illustractive and not restrictive, the scope of the invention being indicated by the appended claims rather than by the foregoing description and all changes which come within the meaning and range of equivalency of the claims are therefore intended to be embraced therein.

What is claimed is:

1. An optical head comprising:

a semiconductor laser;

a substrate having a hollow thereon, mounting the semiconductor laser in the hollow;

a mirror for reflecting a light beam emitted from said semiconductor laser so as to reflect an optical path of said light beam, said mirror formed on a side wall of the hollow;

a diffraction grating which is arranged in close vicinity to said semiconductor laser for dividing said light beam reflected from said mirror into three beams in which there are zero-order, plus first-order, and minus first-order beams;

a holographic diffraction grating being arranged at an optical path of said three beams divided by said diffraction grating;

an objective lens for focusing said three beams on an optical recording medium;

a photodetector for detecting a tracking error signal by receiving said three beams diffracted by said holographic diffraction grating;

wherein,
said semiconductor laser is mounted on the substrate faced to said diffraction grating, at a place where either of said plus first-order beam or said minus first-order beam reflected from said optical recording medium illuminates a surface of the semiconductor laser,
said surface of the semiconductor laser illuminated by either of said first order beams is made to absorb or diffuse light.

2. The optical head according to claim 1,
a wire for supplying an electric current into said semiconductor laser is bonded on the beam incident area.

3. The optical head according to claim 1,
a nonreflection coating is coated on the beam incident area.

4. The optical head according to claim 1,
a dome-like projection is formed on the bean incident area.

5. The optical head according to claim 1,
a prism-like projection is formed on the beam incident area.

6. The optical head according to claim 1,
a grating-like unevenness is formed on the beam incident area.

7. The optical head according to claim 1, wherein
said beam incident area is inclining to said illuminating beam.

8. The optical head according to claim 1, wherein
a roughed surface is formed on the beam incident area.

9. An optical head comprising:
a semiconductor laser;
a substrate having a hollow thereon, mounting the semiconductor laser in the hollow;
a mirror for reflecting a light beam emitted from said semiconductor laser so as to reflect an optical path of said light beam, said mirror formed on a side wall of the hollow;
a diffraction grating which is arranged in close vicinity to said semiconductor laser for dividing said light beam reflected from said mirror into three beams in which there are zero-order, plus first-order, and minus first-order beams;
a holographic diffraction grating being arranged at an optical path of said three beams divided by said diffraction grating;
an objective lens for focusing said three beams on an optical recording medium;
a photodetector for detecting a tracking error signal by receiving said three beams diffracted by said holographic diffraction grating,
wherein,
said substrate has a beam incident area formed on a surface, located on the opposite side from said semiconductor laser with respect to said mirror and faced to the diffraction grating, either said plus first-order or said minus first-order beam reflected from said optical recording medium illuminates thereon;
said surface of the beam incident area on the substrate is made to absorb or diffuse light.

10. The optical head according to claim 9,
a wire is bonded on the beam incident area.

11. The optical head according to claim 9,
a nonreflection coating is coated on the beam incident area.

12. The optical head according to claim 9,
a dome-like projection is formed on the beam incident area.

13. The optical head according to claim 9,
a prism-like projection is formed on the beam incident area.

14. The optical head according to claim 9,
a grating-like unevenness is formed on the beam incident area.

15. The optical head according to claim 9,
said beam incident area is inclining to said illuminating beam.

16. The optical head according to claim 9, wherein
a roughened surface is formed on the beam incident area.

* * * * *

UNITED STATES PATENT AND TRADEMARK OFFICE
CERTIFICATE OF CORRECTION

PATENT NO. : 5,517,479
DATED : May 14, 1996
INVENTOR(S) : Hideyuki Nakanishi et al.

It is certified that error appears in the above-indentified patent and that said Letters Patent is hereby corrected as shown below:

Column 7, line 1, after "1," insert --wherein--;

line 3, delete "the beam incident area";

line 3, after "on" insert --said surface of said semiconductor laser illuminated by either of said first order beams--;

line 4, after "1," insert --wherein--;

line 5, delete "the beam incident area";

line 5, after "on" insert --said surface of said semiconductor laser illuminated by either of said first order beams--;

line 7, after "1," insert --wherein--;

UNITED STATES PATENT AND TRADEMARK OFFICE
CERTIFICATE OF CORRECTION

PATENT NO. : 5,517,479
DATED : May 14, 1996
INVENTOR(S) : Hideyuki Nakanishi et al.

It is certified that error appears in the above-indentified patent and that said Letters Patent is hereby corrected as shown below:

line 8, delete "the bean incident area";

line 8, after "on" insert --said surface of said semiconductor laser illuminated by either of said first order beams--;

line 10, after "1," insert --wherein--;

line 11, delete "the beam incident area";

line 11, after "on" insert --said surface of said semiconductor laser illuminated by either of said first order beams--;

UNITED STATES PATENT AND TRADEMARK OFFICE
CERTIFICATE OF CORRECTION

PATENT NO.   : 5,517,479                    Page 3 of 4
DATED        : May 14, 1996
INVENTOR(S)  : Hideyuki Nakanishi et al.

It is certified that error appears in the above-indentified patent and that said Letters Patent is hereby corrected as shown below:

line 14, after "1," insert --wherein--;

line 15, delete "the beam incident area";

line 15, after "on" insert --said surface of said semiconductor laser illuminated by either of said first order beams--;

line 18, delete "beam incident area" and "illuminating";

line 19, before "beam" insert --light--;

line 21, after "on" insert --said surface of said semiconductor laser illuminated by either of said first order beams--;

UNITED STATES PATENT AND TRADEMARK OFFICE
CERTIFICATE OF CORRECTION

PATENT NO. : 5,517,479
DATED : May 14, 1996
INVENTOR(S) : Hideyuki Nakanishi et al.

It is certified that error appears in the above-indentified patent and that said Letters Patent is hereby corrected as shown below:

line 21, delete "the beam incident area".

Column 8, line 32, after "9," insert --wherein--;

line 33, delete "illuminating" and insert --light--.

Signed and Sealed this

Fourteenth Day of October, 1997

*Attest:*

BRUCE LEHMAN

*Attesting Officer*     *Commissioner of Patents and Trademarks*